United States Patent [19]

Robertson et al.

[11] 4,110,124
[45] Aug. 29, 1978

[54] THICK FILM THERMOCOUPLES

[75] Inventors: Allen R. Robertson, Edison; James S. Hill, Cranford, both of N.J.

[73] Assignee: Engelhard Minerals & Chemicals Corporation, Iselin, N.J.

[21] Appl. No.: 615,583

[22] Filed: Sep. 22, 1975

[51] Int. Cl.$^2$ .......................... H01V 1/14; H01B 1/02
[52] U.S. Cl. .............................. 136/236 R; 136/241; 252/514; 73/359 R
[58] Field of Search ............ 136/236 R, 241; 73/359; 252/514, 518.1; 75/208 R; 29/420.5, 573

[56] References Cited

U.S. PATENT DOCUMENTS

| | | | |
|---|---|---|---|
| 3,099,575 | 7/1963 | Hill | 75/208 R |
| 3,207,706 | 9/1965 | Hoffman | 252/514 |
| 3,679,606 | 7/1971 | Short | 252/514 |
| 3,781,749 | 12/1971 | Iles et al. | 338/287 |
| 3,843,350 | 10/1974 | Larry | 252/514 |
| 3,876,560 | 4/1975 | Kuo et al. | 252/514 |
| 3,891,450 | 6/1975 | Trease | 252/514 |

OTHER PUBLICATIONS

Stainer et al., "Thick Film Thermocouple Gages . . . ," 10/30/69, pp. 581-591 to 581-587, Advanced in Instrumentation, Proceedings of 24th ISA Conference, S0167-0045.

Primary Examiner—Nelson Moskowitz

[57] ABSTRACT

A thick film thermocouple matching the performance of solid wire thermocouples and capable of operating at high temperatures with minimal drift is produced by (1) forming two powdered metal pastes of differing compositions, each including a frit which is substantially neutral with respect to the metal components of the respective paste and has essentially no effect upon the thermoelectric EMF, (2) applying the pastes to a surface to form a pair of thick film elements overlapping at one point which form a thermocouple upon firing, (3) firing the applied pastes, and (4) attaching leads to the fired elements and assembling the finished thermocouple. Optionally, the thermocouple elements or legs may be overglazed to protect them against damage to the metal films and to improve stability during continuous use at high temperatures.

20 Claims, 3 Drawing Figures

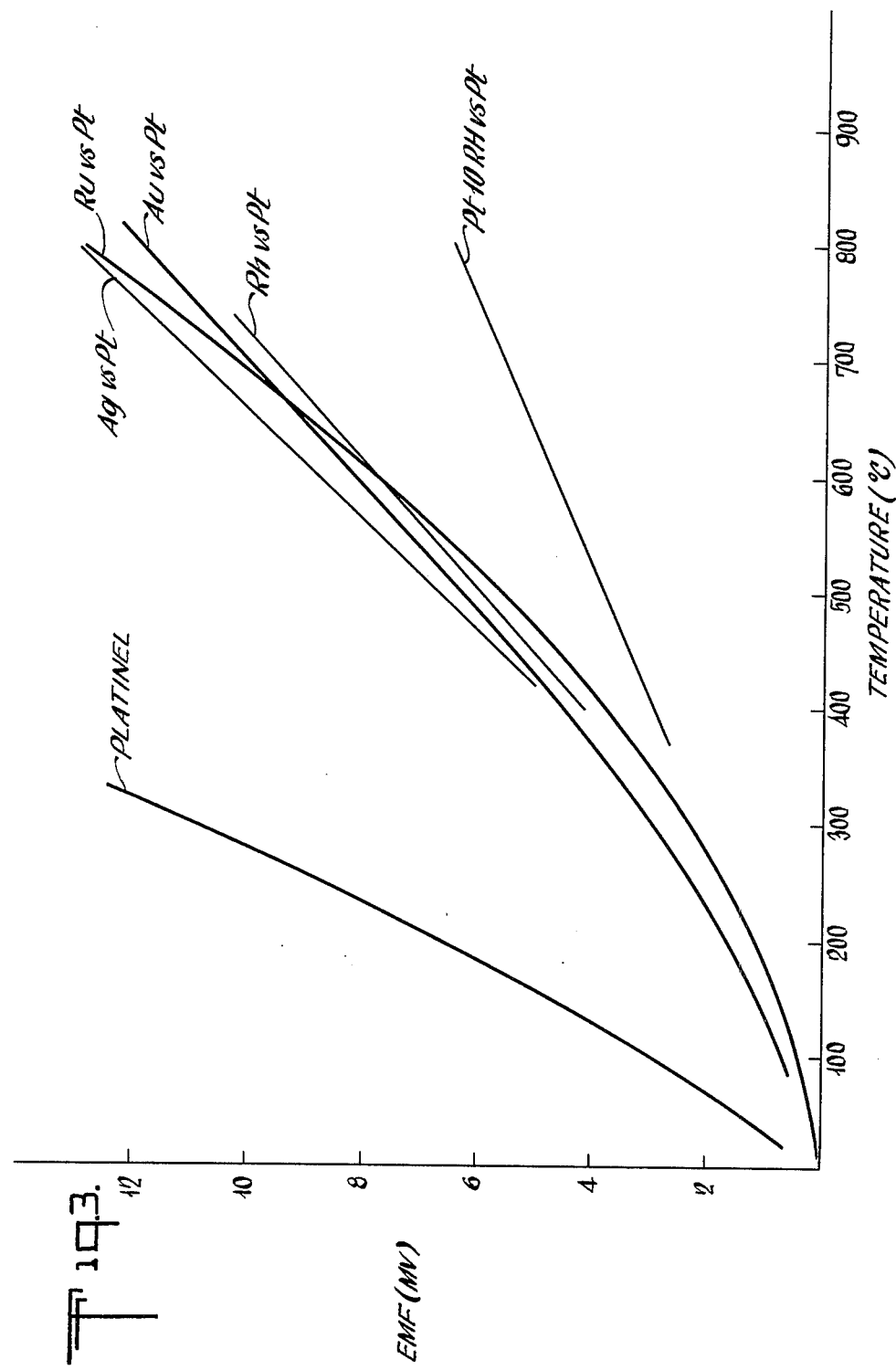

THICK FILM THERMOCOUPLES

BACKGROUND OF THE INVENTION

The present invention generally relates to thermocouples and to the method of making thermocouples. More specifically, the invention is related to thermocouples made by thick film technology wherein metal pastes containing frit are applied by known printing or coating techniques to a suitable surface, subsequently fired and assembled as a thermocouple.

Thermocouples have been in widespread use for many years. The small electrical voltage generated at the junction of two dissimilar metals changes in proportion to the temperature of the junction (relative to a reference temperature). With the standardized thermocouples in common use a reasonably linear response of the voltage produced to the temperature is obtained.

Measurement of high temperatures with thermocouples is possible; however, due to the deterioration of the metals at high temperatures, difficulties in maintaining a stable voltage have been experienced. In U.S. Pat. No. 3,066,177, the inferior performance at temperatures above 1100° C typical of Chromel-Alumel ® thermocouples is discussed, and a replacement for such thermocouples which employs precious metals and exhibits long term stability at high temperatures was disclosed and claimed. While Chromel-Alumel ® thermocouples have a positive leg of 90 percent nickel and 10 percent chromium and a negative leg of 94 percent nickel, 3 percent manganese, 2 percent aluminum and 1 percent silicon, the improved thermocouples, which are available commercially under the name Platinel ®, have a positive leg of 50–85 percent palladium, 10–35 percent platinum, and 2–15 percent gold and a negative leg of 60–70 percent gold and 30–40 percent palladium.

In particular, two compositions are presently commercially produced: Platinel ®I, having a positive leg of the nominal composition 83 percent palladium, 14 percent platinum, 3 percent gold, all by weight, and a negative leg having a nominal composition of 65 percent gold and 35 percent palladium by weight; and Platinel ®II, having a positive leg of the nominal composition 55 percent palladium, 31 percent platinum, and 14 percent gold by weight and a negative leg having a nominal composition of 65 percent gold and 35 percent palladium by weight. These compositions match the standard Chromel-Alumel ® thermocouple performance, (which itself meets those for Type K thermocouples set by the Instrument Society of America) and they can be used with the same electronic measuring equipment as the Chromel-Alumel ® thermocouples.

Typically thermocouples are constructed with solid wire, as are the Chromel-Alumel ® and Platinel ® thermocouples mentioned above. In U.S. Pat. No. 3,099,575, thermocouples are described which are made by thick film technology as used in thick film hybrid micro-circuits. The thermocouple legs are made of components selected from the group consisting of platinum, palladium, iridium, rhodium, and gold. No frit is utilized in the manufacture of such thermocouple films. However, such thermocouples have unsatisfactory adhesion to the surface on which they are placed and their electrical performance is inconsistent.

Glass frits of various sorts are widely used in the electronic thick film industry as binders and their relative amounts may vary widely. In the manufacture of conductors, the metal conductivity is achieved essentially by using sufficient metal and is not significantly affected by the frit. However, the composition of the frit can be important in resistor applications. For example, U.S. Pat. No. 3,207,706 discusses the effect of frits on the Temperature Coefficient of Resistance (TCR) and resistance stability (drift). Since electronic applications typically operate at low temperatures, such as military circuit specifications of −55° C to 155° C, the performance of the frits at high temperatures of operation is of little concern.

It is well known in the thermocouple art that the composition of thermocouple wires must be carefully controlled in order to assure consistent electrical performance. Therefore, it would be expected by those skilled in the thermocouple art that addition of extraneous materials such as a frit to the thick film paste would have deleterious effects on the electrical performance of the thermocouple.

Thick films including a metal component and a frit have been successfully used in the manufacture of resistance thermometers, of which U.S. Pat. No. 3,781,749 is an example. However, in contrast to the thermoelectric effect created in thermocouples by use of two dissimilar elements, the variation of electrical resistance of a single element with temperature is used to measure temperature in a resistance thermometer. A survey in *Instrument Practice*, May 1966, discusses some of such applications, which in general involve measurement of transient conditions where the rapid response of a thick film is of particular value.

It would be desirable to form thick film thermocouples which could adequately withstand high temperature exposure and retain the electrical stability and physical durability typical of the precious metal thermocouples presently used. Such thick film thermocouples would be less expensive and could directly replace solid wire thermocouples in many applications. For other applications, thick film thermocouples would be preferred to obtain rapid response to temperature changes and other inherent advantages of directly applying the thermocouple legs to the surface being measured. Preferably, they would be formulated to achieve an EMF response matching that of the standard solid wire thermocouples. However, non-standard thermocouples could be used if measuring equipment were designed especially to suit the voltage they produce in response to changes in temperature.

In accordance with the present invention, there is disclosed a thick film thermocouple using a frit and exhibiting substantially improved mechanical properties while at the same time having essentially no effect on the electrical response. Such thick film thermocouples are disclosed below in greater detail.

SUMMARY OF THE INVENTION

In accordance with the invention, there is provided a two-component system for use in forming by thick film techniques a thermocouple having joined positive and negative elements on a common surface, applied directly if the surface is non-conductive or onto an insulating film if the surface is electrically conductive. This system comprises a first paste and a second paste for application individually to the surface and firing thereon to form respective elongated films overlapping only at a thermoelectric junction area. Each of these pastes consists essentially of (a) a powdered metal component comprising at least one metal selected from the group consiting of platinum, palladium, iridium, rhodium, ruthenium, gold and silver, (b) a frit in amount by weight equal to between about 5-35 percent of the combined weight of the metal component and frit, the components of the frit being neutral with respect to the thermoelectric EMF developed by the thermocouple in order to minimize EMF drift during operation, and (c) an organic liquid vehicle. The composition of the powdered metal components in the first paste is different from that of the second paste in order to provide a suitable thermoelectric EMF across the thermocouple junction. The powdered metal component and the frit are admixed and suspended in the vehicle in each of the pastes.

A thermocouple in accordance with the invention comprises a support member and elongated positive and negative elements deposited directly on the surface of the support if electrically non-conductive or onto an insulating film if the support suface is conductive. Each element is comprised after firing of powdered metal components and frit as aforesaid. The two elements contact each other only at the junction area across which the thermoelectric EMF is to be developed. Suitable mounting arrangements for the supporting surface and for connecting electric leads to the positive and negative elements thereon may be provided.

In accordance with the invention, the method of making a thermocouple by thick film techniques comprises the steps of providing a first paste consisting essentially of the aforesaid powdered metal component, the aforesaid neutral frit, and an organic liquid vehicle. A second paste also is provided, consisting essentially of a similar powdered metal component containing at least one or more of the aforementioned metals but differing in composition so as to provide a thermoelectric EMF, of a similar or identical neutral frit, and of organic liquid vehicle. The first paste is applied as a first elongated film on an electrically insulating surface, and the second paste is applied as a second elongated film on the surface with the second film overlying the first film only at a junction area. The first and second elongated films are fired on the surface to remove the vehicles, bond the films to the surface, and form electrically conductive positive and negative thermocouple elements from the first and second films respectively.

Thick film thermocouples made in accordance with preferred embodiments of the present invention have electrical stability and physical durability at high temperatures and match the performance of the more expensive solid wire thermocouples. In such cases, direct substitition for solid wire thermocouples is possible. Where direct substitution for solid wire thermocouples is unnecessary, compositions can be used for thick film thermocouples which provide some desired relation between EMF and temperature although they would require measuring equipment designed especially to match their performance.

The performance of the thick film thermocouple of a particularly preferred embodiment of the invention matches extremely closely the voltage produced by the solid wire precious metal thermocouples of U.S. Pat. No. 3,066,177 and may be directly substituted therefor. Where long service life is important the thermocouple is limited to a maximum useful temperature of about 800°-850° C. However, for short exposures, much higher temperatures can be measured.

BRIEF DESCRIPTION OF THE DRAWINGS

FIG. 3 is a graph illustrating the performance of thick film thermocouples prepared from various precious metals.

DESCRIPTION OF THE PREFERRED EMBODIMENTS

Figure 1:
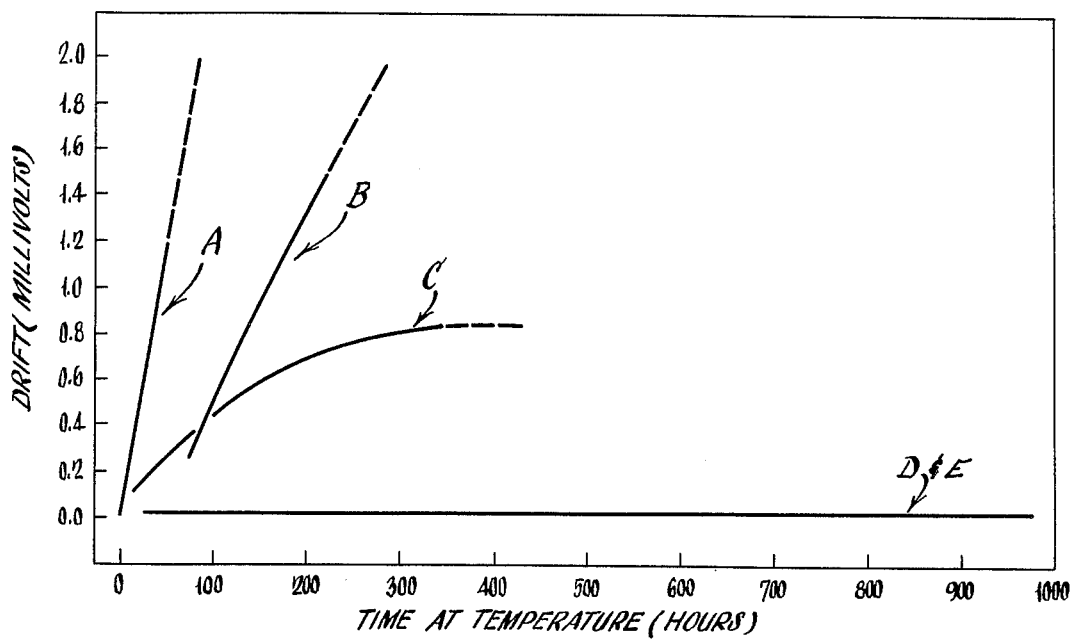
FIG. 1 is a graph illustrating the effect of various frits on the performance of thick film thermocouples.

When thick film thermocouples of the present invention are intended to match the performance of the Platinel ® thermocouples, metal compositions corresponding to those typically used for solid wire thermocouples are used for the positive and negative legs. However, other compositions may be used when such a matching of standard thermocouple performance is not needed. A number of precious metals and alloys thereof could be used in combination to produce specialized thick films thermocouples having a particularly desired EMF output as related to temperature. While they could not be substituted directly for the standardized thermocouples, if provided with measuring equipment designed especially for such specialized thermocouples, they could be successfully used for temperature measurement. As an example, thermocouples can be made in which one leg contains only platinum metal and the second leg contains such metals as palladium, rhodium, iridium, gold, silver, and ruthenium, either singly or in combination. Additionally, thermocouples can be formed in which the positive leg comprises one or more metals selected from the group consisting of platinum, palladium, iridium, rhodium, ruthenium, gold, and silver, while the negative leg comprises one or more metals from the same group, although the compositions of the two legs differ in order to obtain an operative thermocouple.

Although matching of Platinel ® thermocouples, which themselves correspond to Type K established by the Instrument Society of America, is possible in a particularly preferred embodiment of the invention, several other standard types may also be mentioned as examples. Type S, having a nominal composition of 90 percent platinum —10 percent rhodium in its positive leg and platinum alone as its negative leg, is one such standard thermocouple which could be made by the method of the invention. Type B, having a nominal composition of 70 percent platinum — 30 percent rhodium in its positive leg and 94 percent platinum and 6 percent rhodium as its negative leg, and Type R, having a nominal composition of 87 percent Pt-13% Rh and platinum alone as its negative leg are other such standard thermocouples.

When thermocouples are to be made corresponding to those of U.S. Pat. No. 3,066,177, the positive element preferably utilizes a powdered metal component consisting essentially of 2-15 percent gold, 50-85 percent palladium, and 10-35 percent platinum by weight, and the negative element preferably utilizes a powdered metal component consisting essentially of 60-70 percent gold and 30-40 percent palladium by weight. In a specific embodiment, matching the Platinel ® thermocouples, the positive thermocouple element advantageously is formed using a paste containing a powdered metal component or powdered alloy consisting of about 83 percent palladium, about 14 percent platinum, and about 3 percent gold by weight, while the negative thermocouple element in contact therewith is formed using a paste containing a powdered metal component or powdered alloy consisting of about 65 percent gold and about 35 percent palladium by weight. In another such specific embodiment, the positive element is formed using a paste containing a powdered metal component or powdered alloy consisting of about 55 percent palladium, about 31 percent platinum and about 14 percent gold by weight, the negative element utilizing the same 65-35 gold-palladium composition.

The thick film thermocouple elements are formed in a similar manner to that used in the micro-electronics industry. Finely divided metal and frit powders are mixed with a vehicle to form a paste of proper consistency for application to a surface. After application by screen printing or other suitable technique such as brushing, rolling, stamping and the like, the resulting film is dried and then fired at high temperatures to volatilize and remove the vehicle, while bonding the film to the surface. The paste must be formulated, with particular attention to the frit, to provide satisfactory mechanical properties while avoiding unsatisfactory electrical performance. In the formation of a thick film thermocouple, any effect of the frit on performance at the higher operating temperatures becomes important. In some instances, drift of thermoelectric EMF at temperatures in the range to be measured is excessive and the frit prevents the thermocouple from retaining its intended EMF vs. temperature response. Certain frits have been found to have no apparent interaction with the metals used and drift is negligible as will be seen in FIG. 1, discussed hereinbelow in greater detail. Such frits may be said to be neutral with respect to the metallic constituents. While the mechanisms by which such neutral behavior are obtained are not fully understood, it is believed that the frit should contain no constituent which is reducible to the metallic state wherein it would alloy with the metallic components and thus change the thermoelectric properties of the film. Likewise, it is believed that the frit should contain no constituent which can react with a metallic component of the film to form a compound having a deleterious effect on thermoelectric properties. The frit should be neutral with regard to the metal components if they are to retain in a thick film the thermoelectric properties characteristic of typical solid wire thermocouples. Also it will be understood that the frit must be compatible with the substrate, and must not react with the atmosphere during firing or at operating temperatures, or otherwise suffer degradation or decomposition causing loss of adhesion to the substrate.

FIG. 1 illustrates the performance of five commercially available frits. In each case two thick film pastes were made, one for each of the positive and negative legs corresponding to Platinel® I. Finely powdered alloys having a particle size less than 20 microns were mixed with each of the four frits having a particle size less than 5 microns to produce dry mixtures containing 85 percent alloy and 15 percent frit by weight. The dry mixed metal powder and frit were then mixed in a roll mill with sufficient vehicle (5-15 percent ethyl cellulose in butyl carbitol acetate) to produce a uniform paste having a viscosity suitable for screen printing through a 325 mesh screen.

Other suitable organic liquid vehicles may be substituted for the ethyl cellulose in butyl carbitol acetate used in the paste of FIG. 1. Vehicles generally comprise two ingredients, a thickening resin and a solvent. The resins control paste viscosity to that suitable for the method of application, which is typically screen printing for thick film applications. Examples of such resins include polystyrenes, polyterpenes, polymethacrylates and ethyl cellulose. The solvents are usually non-polar organic liquids having a relatively low vapor pressure at room temperature. Examples include butyl carbitol acetate, ethyl naphthalene, phenylcyclohexane, terpenes such as pine oil, alpha- and beta-terpineol and the like, and mixtures of aliphatic and aromatic hydrocarbons.

The positive thermocouple leg in each example of FIG. 1 was printed on a surface of alumina followed by printing of the negative leg, which only touched the positive leg at their junction area or point where the temperature would be measured. After printing, the films on alumina were fired in air in a typical continuous belt furnace using a cycle providing a period of ten minutes at about 100° C for preliminary drying of the vehicle followed by a uniform increase over 45 minutes to a temperature of 1000° C, and then holding at that temperature for fifteen minutes. After firing, the films on alumina were gradually cooled to ambient temperature.

Leads were attached to each of the fired thermocouples and then they were tested at a constant temperature of 700° C in air to determine the long-term stability. As will be clear from FIG. 1, frit A apparently interacted with the metals, affecting the thermocouple stability dramatically. After 100 hours the thermocouple made with frit A had drifted more than 20 millivolts. After about 300 hours, this was also true of the thermocouple using frit B. The performance of frit C was better but still unsatisfactory. When it is realized that a variation of about 4.1 millivolts corrresponds to a difference of 100° C, it will be clear that the performance of any of frits A, B, and C would be unsatisfactory for any but the shortest exposure. The thermocouples formulated with frits D and E, however, show substantially no drift over a period of about 1000 hours' exposure. The composition of the frits of FIG. 1 are given in Table A.

The lead-containing frits A, B, and C, similar to those lead borosilicate frits commonly used in the thick-film microelectronics industry in pastes for resistor elements and the like, appear unsatisfactory for thermocouple applications, where the fired films perform a markedly different function. Particular care would have to be exercised to avoid frit constituents which tend to be unstable during firing and producing a change of the thermoelectric properties of the film. Frit constituents containing more or less easily reducible oxides of metals such as lead, copper, cadmium, bismuth, nickel, cobalt, and iron should be avoided if possible in favor of more stable oxides or if unavoidable the combined total should be maintained below one weight percent. By essentially excluding or closely controlling the amounts of such relatively easily reducible oxides, the thermoelectric EMF of the thermocouples of the invention may be stabilized and the drift during continuous operation minimized. Nevertheless, such metals may be provided as stable compounds instead of reducible oxides. Alternatively, relatively unstable compounds might be used if they react with other constituents or materials present during firing of the paste to form stable compounds, such as a silicate or titanate compound, which have the necessary stability while providing the required wetting and sintering characteristics. Particular care in choice of stable frit compositions also is indicated if the firing or operation of the thermocouple is to be carried out under reducing conditions. Firing or operation in air would be generally preferred.

nium, gold, and rhodium versus platinum. Also, the performance of platinum versus 90 percent platinum — 10 percent rhodium is also shown (Type S equivalent).

The foregoing description of the preferred embodi-

TABLE A

| Frit | PbO | SiO$_2$ | B$_2$O$_3$ | CuO | Bi$_2$O$_3$ | CdO | Al$_2$O$_3$ | Na$_2$O | CaO | MgO | ZnO | TiO | BaO | Balance |
|---|---|---|---|---|---|---|---|---|---|---|---|---|---|---|
| A | 23 | 6.6 | 3.4 | 8 | 59 | — | — | — | — | — | — | — | — | — |
| B | 62.2 | 21.4 | 8.5 | — | — | 4.9 | 3.0 | — | — | — | — | — | — | — |
| C | 16.2 | 19.3 | — | — | — | — | 13.2 | — | — | — | 11.2 | 8.4 | 7.8 | 23.9 |
| D | — | 65.0 | 21.9 | — | — | — | 8.2 | 4.4 | 0.3 | 0.2 | — | — | — | — |
| E | — | 52.5 | 36.3 | — | — | — | 1.0 | 7.3 | 2.9 | — | — | — | — | — |

Although an 85/15 weight ratio of powdered metal to frit is typical, the frit may be included in amounts between about 5 percent and 35 percent of the combined weight of the metal plus frit, as limited by high electrical resistance above about 35 percent frit is used and by inferior adhesion when below about 5 percent frit is used. Frit in amounts between 10–20 percent of the combined weight of the metal and frit are generally preferred.

Figure 2:
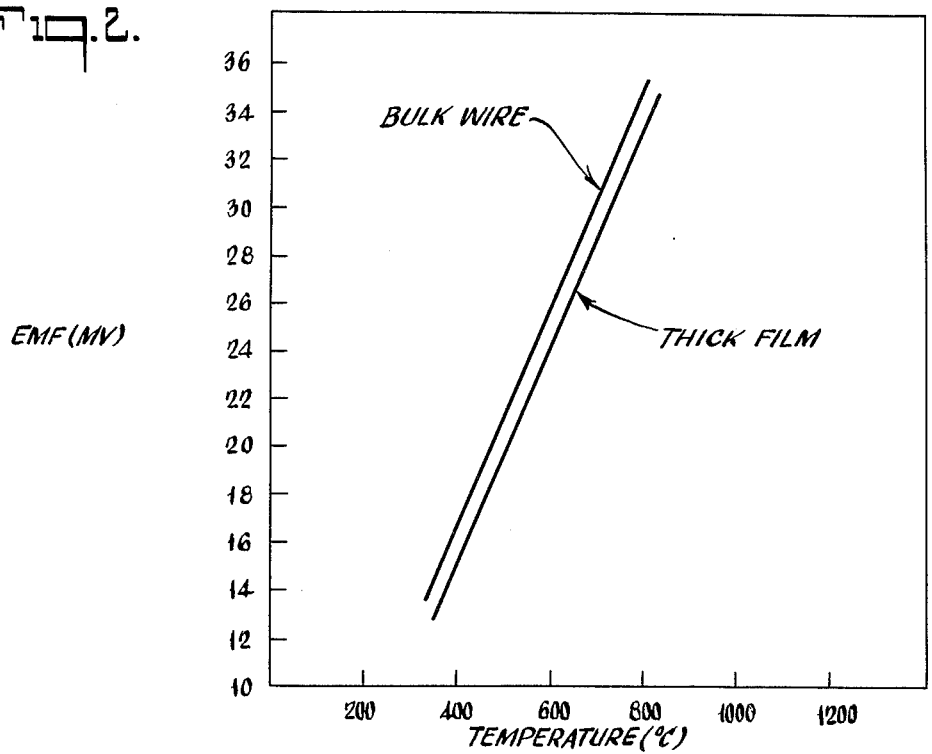
FIG. 2 is a graph comparing the performance of thermocouples according to the invention with the prior art precious metal thermocouples.

Using the proper frit such as frit D or E the relative performance of the thermocouple, as illustrated in Example 1, can remain quite stable over an extended period. The absolute performance of such thermocouples is shown in FIG. 2 where a thermocouple corresponding to that shown by curve D and E in FIG. 1 can be seen to essentially parallel that of the standard solid wire Platinel ® thermocouple over a wide range of temperatures. By careful adjustment of the composition the thick film thermocouple can meet the EMF standard within ± ⅜ percent tolerance. As FIGS. 1 and 2 illustrate, a thermocouple fabricated according to the invention is capable of direct substitution for the more expensive solid wire thermocouples heretofore used, up to temperatures in the range of 800°–850° C for continuous operation in air. For short time exposures, higher temperatures can be measured.

It has been found especially useful in forming stable and uniform thermocouples according to the invention to use, as the powdered metal components in the pastes, alloys made by any of the various known procedures. Examples include atomization of the molten alloy, pulverizing of metallic sponges, chemical alloy precipitation, and mechanical alloying of mixtures of different metal powders using milling techniques. Alternatively, the paste may comprise a mixture of powders of the individual metals constituting the alloy, the alloying then being consummated during the firing process.

It will be appreciated that in most applications long-term stability is an extremely valuable property of any thermocouple. In order to further improve the stability of the thermocouple of the invention an additional protective glaze may be used to cover the fired thermocouple. Overglaze materials containing lead oxide, and ordinarily also oxides of copper, cadmium, bismuth, nickel, cobalt, and iron, likewise preferably should be avoided. In one specific embodiment a frit such as frit D is mixed with a suitable vehicle and applied to the fired thermocouple, followed by refiring in the furnace at a temperature of 950°–1000° C to soften the frit and form the glaze.

In other embodiments of the invention thick film thermocouples can be made with other precious metals, as previously described. Examples of the performance of such thermocouples are given in FIG. 3. While the EMF produced is lower than for the Type K/Platinel ® thermocouple, significant EMF values are shown for thick film thermocouples of silver, ruthenium, gold, and rhodium versus platinum. Also, the performance of platinum versus 90 percent platinum — 10 percent rhodium is also shown (Type S equivalent).

The foregoing description of the preferred embodiments is for illustration only and should not be considered to limit the scope of the invention as defined by the claims which follow.

What is claimed is:

1. A two-component system for use in forming by thick film techniques a thermocouple having joined positive and negative elements on a common electrically nonconductive surface, comprising:
   a first paste and a second paste for application individually to said surface and firing thereon to form two films overlapping only at a thermoelectric junction area;
   each of said pastes consisting essentially of (a) a powdered metal component consisting of at least one metal selected from the group consisting of platinum, palladium, iridium, rhodium, ruthenium, gold, and silver, (b) a frit in amount by weight equal to between about 5–35 percent of the combined weight of metal and frit, said frit containing constituents neutral with respect to said metal components and a total of less than one weight percent of constituents capable of causing a significant detrimental effect on the thermoelectric EMF produced at said junction whereby the thermoelectric EMF of said thermocouple is stablized and drift of said EMF during operation is minimized, and (c) an organic liquid vehicle;
   the composition of said powdered metal components in said first and second pastes being sufficiently different to provide said thermoelectric EMF across said junction; and
   said powdered metal component and said frit being admixed and suspended in said vehicle in each of said pastes.

2. The two-component system of claim 1, wherein said powdered metal component of said first paste consists essentially of about 50–85 percent palladium, about 10–35 percent platinum, and about 2–15 percent gold by weight for forming a positive thermocouple element, and said powdered metal component of said second paste consists essentially of about 60–70 percent gold and about 30–40 percent palladium by weight for forming a negative thermocouple element.

3. The two-component system of claim 2, wherein said powdered metal component of said first paste consists essentially of a powdered alloy containing about 83 percent palladium, about 14 percent platinum, and about 3 percent gold by weight for forming a positive thermocouple element, and said powdered metal component of said second paste consists essentially of a powdered alloy containing about 65 percent gold and about 35 percent palladium by weight for forming a negative thermocouple element.

4. The two-component system of claim 2, wherein said powdered metal component of said first paste consists essentially of a powdered alloy containing about 55 percent palladium, about 31 percent platinum, and about 14 percent gold by weight for forming a positive thermocouple element, and said powdered metal component of said second paste consists essentially of a powdered alloy containing about 65 percent gold and about 35 percent palladium by weight for forming a negative thermocouple element.

5. The two-component system of claim 1 wherein said frit contains only such amounts of lead oxides as cause no significant detrimental effect upon the thermoelectric EMF drift of the formed thermocouple.

6. The two-component system of claim 1 wherein said frit contains a total of less than about one weight percent of the group of metal oxides consisting of lead, copper, cadmium, bismuth, nickel, cobalt, and iron.

7. A thermocouple, comprising:
 a support member providing an electrically nonconductive surface:
 a positive element deposited and fired on said surface, consisting essentially of a first powdered metal component consisting of at least one metal selected from the precious metal group consisting of platinum, palladium, iridium, rhodium, ruthenium, gold, and silver, and between about 5-35 weight percent of a frit adherent to said surface and containing constituents neutral with respect to said first metal component and a total of less than one weight percent of constituents capable of causing a significant detrimental effect on the thermoelectric EMF produced at the junction area of said thermocouple whereby the thermoelectric EMF of said thermocouple is stabilized and drift is minimized during operation; and
 a negative element deposited and fired on said surface and contacting said positive element only at a junction area, consisting essentially of a second powdered metal component consisting of at least one metal selected from said precious metal group but sufficiently different in composition from said first powdered metal component so as to provide said thermoelectric EMF across said junction, and between about 5-35 weight percent of a frit containing constituents neutral with respect to said second metal component and a total of less than one weight percent of constituents capable of causing a significant detrimental effect on the thermoelectric EMF produced at the junction area of said thermocouple whereby said thermoelectric EMF of said thermocouple is stabilized and drift is minimized during operation.

8. The thermocouple of claim 7, in which said first powdered metal component consists essentially of about 50-85 percent palladium, about 10-35 percent platinum, and about 2-15 percent gold by weight, and said second powdered metal component consists essentially of about 60-70 percent gold and about 30-40 percent palladium by weight.

9. The thermocouple of claim 8, in which the fired frit of each of said elements is present in amount by weight equal to between about 5-35 percent of the combined weight of the metal and frit in that element.

10. The thermocouple of claim 9, in which the frit is present in each of said elements in amount between about 10-20 percent of the combined weight of the metal and frit therein.

11. The thermocouple of claim 7, in which said positive and negative elements are covered by a fired adherent overglaze.

12. The thermocouple of claim 8, in which said first powdered metal component is an alloy of about 83 percent palladium, about 14 percent platinum, and about 3 percent gold by weight, and said second powdered metal component is an alloy of about 65 percent gold and about 35 percent palladium by weight.

13. The thermocouple of claim 8, in which said first powdered metal component is an alloy of about 55 percent palladium, about 31 percent platinum, and about 14 percent gold by weight, and said second powdered metal component is an alloy of about 65 percent gold and about 35 percent palladium by weight.

14. A method of making a thermocouple, comprising the steps of:
 (1) providing a first paste and a second paste adapted for application to and firing on a surface to form thermocouple elements thereon, each of said pastes consisting essentially of (a) a powdered metal component consisting of at least one metal selected from the group consisting of platinum, palladium, iridium, rhodium, ruthenium, gold, and silver, (b) a frit in amount by weight equal to between about 5-35 percent of the combined weight of metal and frit, said frit containing constituents being neutral with respect to said metal components and a total of less than one weight percent of constituents capable of causing a significant detrimental effect on the thermoelectric EMF produced at said junction, whereby the thermoelectric EMF of said thermocouple is stabilized and drift of said EMF during operation is minimized and (c) an organic liquid vehicle;
 the composition of said powdered metal components in said first and second pastes being sufficiently different to provide said thermoelectric EMF across such junction, and said powdered metal component and said frit being admixed and suspended in said vehicle in each of said pastes;
 (2) applying said first paste as a first film on an electrically nonconductive surface;
 (3) applying said second paste as a second film on said surface with said second film overlying said first film only at a junction area; and
 (4) firing said first and second films on said surface to eliminate said vehicles and form adherent, electrically conductive positive and negative thermocouple elements from said first and second films respectively.

15. The method of claim 14, wherein said first paste is provided with a powdered metal component consisting essentially of about 50-85 percent palladium, about 10-35 percent platinum, and about 2-15 percent gold by weight, and said second paste is provided with a powdered metal component consisting essentially of about 60-70 percent gold and about 30-40 percent palladium by weight.

16. The method of claim 15, wherein said first paste is provided with a powdered metal component consisting essentially of about 83 percent palladium, about 14 percent platinum, and about 3 percent gold by weight, and said second paste is provided with a powdered metal component consisting essentially of about 65 percent gold and about 35 percent palladium by weight.

17. The method of claim 15, wherein said first paste is provided with a powdered metal component consisting essentially of about 55 percent palladium, about 31 percent platinum, and about 14 percent gold by weight, and said second paste is provided with a powdered metal component consisting essentially of about 65 percent gold and about 35 percent palladium by weight.

18. The method of claim 14, wherein said firing step (4) is carried out by drying the films applied to the surface in step (4) at a temperature of about 100°–150° C for at least 10 minutes, increasing the temperature to about 1000° C during a period of about 45 minutes, then holding at about 1000° C for a period of about 15 minutes.

19. The method of claim 14, wherein, following said firing step (4), a glazing formulation is applied to the fired films, followed by firing to form thereon an adherent overglaze.

20. The method of claim 19, wherein said glazing formulation consists essentially of a frit and an organic liquid vehicle, and said frit in both of said pastes and in said glazing formulation having substantially the same composition.

* * * * *